United States Patent
Hsu et al.

[11] Patent Number: 6,049,495
[45] Date of Patent: Apr. 11, 2000

[54] AUTO-PROGRAMMABLE CURRENT LIMITER TO CONTROL CURRENT LEAKAGE DUE TO BITLINE TO WORDLINE SHORT

[75] Inventors: Louis L. C. Hsu; Giuseppe La Rosa, both of Fishkill; Jack A. Mandelman, Stormville, all of N.Y.

[73] Assignee: International Business Machines Corporation, Armonk, N.Y.

[21] Appl. No.: 09/243,646

[22] Filed: Feb. 3, 1999

[51] Int. Cl.⁷ .............................. G11C 7/00; G11C 16/04
[52] U.S. Cl. ................. 365/203; 365/189.09; 365/201
[58] Field of Search ................. 365/189.09, 201, 365/203

[56] References Cited

U.S. PATENT DOCUMENTS

| | | | |
|---|---|---|---|
| Re. 35,356 | 10/1996 | Gill | 257/316 |
| 4,725,980 | 2/1988 | Wakimoto et al. | 365/200 |
| 5,010,028 | 4/1991 | Gill et al. | 437/43 |
| 5,060,195 | 10/1991 | Gill et al. | 365/185.33 |
| 5,253,205 | 10/1993 | Eaton, Jr. | 365/203 |
| 5,264,718 | 11/1993 | Gill | 257/316 |
| 5,371,031 | 12/1994 | Gill et al. | 437/43 |
| 5,523,249 | 6/1996 | Gill et al. | 437/43 |
| 5,550,394 | 8/1996 | Sukegawa et al. | 365/200 |
| 5,561,636 | 10/1996 | Kirihata et al. | 365/201 |
| 5,565,371 | 10/1996 | Gill | 437/43 |
| 5,689,465 | 11/1997 | Sukegawa et al. | 365/200 |

*Primary Examiner*—Trong Phan
*Attorney, Agent, or Firm*—McGinn & Gibb, P.C.; Daryl K. Neff, Esq.

[57] ABSTRACT

A method and structure for disconnecting shorted bitlines from a dynamic random access memory circuit includes supplying a precharge voltage to equalization lines in the integrated circuit, supplying a negative voltage to wordlines in the integrated circuit, activating equalization devices connected to the bitlines and the equalization lines and maintaining the precharge voltage and the negative voltage until a short between one of the bitlines and one of the wordlines causes a corresponding equalization device of the equalization devices to have a permanently elevated threshold voltage.

24 Claims, 3 Drawing Sheets

AUTO-PROGRAMMABLE CURRENT LIMITER TO CONTROL CURRENT LEAKAGE DUE TO BITLINE TO WORDLINE SHORT

BACKGROUND OF THE INVENTION

1. Field of the Invention

The present invention generally relates to integrated circuit memory arrays and more particularly to automatically removing shorted bitlines and wordlines from the memory arrays.

2. Description of the Related Art

A "cross fail" is defined as a low resistance leakage path between two lines in an integrated circuit, such as a wordline and a bitline in a memory array. Undesirably large current may be drawn from the voltage supply to ground when a cross fail occurs. For example, in 64 M dynamic random access memory (DRAM) design, each cross fail could increase stand-by current by as much as 300 mA. In order to limit the current flow, a current limiter device such as a depletion mode-N type field effect transistor (NFET) device has conventionally been used.

FIG. 1 illustrates a schematic circuit diagram including bitlines 10, a wordline 11, an equalization control (EQ) line 12, an equalization voltage supply (Vbleq) line 13, a current limiter (e.g., depletion mode device) 14, a wordline driver 16, and a short 15 between one of the bitlines 10 and the wordline 11.

However, the introduction of the depletion device 14, as shown in FIG. 1, increases the chip area and process complexity. For example, such a structure would require an extra threshold voltage (Vt) implant. Additionally, the depletion device itself often degrades performance during the array precharge operation. Thus, the conventional structure shown in FIG. 1, often equalizes bitlines at a level that is different from the predetermined value of Vbleq, which weakens the precharge capability. Such weak precharge capability causes an asymmetric signal sensing margin and finally results in poor sensing speed.

The invention overcomes the conventional problems by removing shorts 15 between the bitlines 10 and wordline 11 without requiring a current limiter 14 as in the conventional structures. Therefore, by eliminating the current limiter 14, the invention avoids the foregoing disadvantages.

SUMMARY OF THE INVENTION

It is, therefore, an object of the present invention to provide a structure and method to exploit the increase in channel threshold voltage (Vt) of metal oxide semiconductor (MOS) devices caused by hot-carrier injection. The invention uses the hot-carrier injected MOS devices as current limiter devices to automatically and permanently weed out the cross fails.

The invention also introduces an effective hot carrier programming method to program metal oxide semiconductor field effect transistors (MOSFETs) on defective bitlines within an acceptable testing time.

One embodiment of the invention is a method for disconnecting shorted bitlines from a dynamic random access memory circuit that includes supplying a precharge voltage to equalization lines in the integrated circuit, supplying a negative voltage to wordlines in the integrated circuit, activating equalization devices connected to the bitlines and the equalization lines and maintaining the precharge voltage and the negative voltage until a short between one of the bitlines and one of the wordlines causes a corresponding equalization device of the equalization devices to have a permanently elevated threshold voltage.

The difference between the precharge voltage and the negative voltage causes an absolute voltage above the normal operating voltage of the equalization devices to be applied to the corresponding equalization device. The absolute voltage causes hot-carrier injection to occur within the corresponding equalization device to permanently elevate the threshold voltage. The elevated threshold voltage of the equalization device disconnects a corresponding one of the bitlines from a portion of the integrated circuit. The absolute voltage is at least twice the normal operating voltage of the equalization devices.

Additionally, the maintaining of the precharge voltage and the negative voltage is performed during a manufacturing or testing process of the dynamic random access memory circuit before a normal operation of the dynamic random access memory circuit. Once the short circuits are removed, the removed devices are replaced with redundant units.

Another embodiment of the invention is a method for disconnecting shorted bitlines from a dynamic random access memory which includes supplying a boosted wordline voltage to equalization lines in the integrated circuit, connecting wordlines in the integrated circuit to ground, activating equalization devices connected to the bitlines and the equalization lines and maintaining the boosted wordline voltage and the ground until a short between one of the bitlines and one of the wordlines causes a corresponding equalization device to have a permanently elevated threshold voltage.

The difference between the boosted wordline voltage and the ground causes an absolute voltage above a normal operating voltage of the equalization devices to be applied to the corresponding equalization device. The absolute voltage causes hot-carrier injection to occur within the corresponding equalization device to permanently elevate the threshold voltage. The elevated threshold voltage of the equalization device disconnects a corresponding one of the bitlines from a portion of the integrated circuit. The absolute voltage is at least twice a normal operating voltage of the equalization devices.

Also, the maintaining of the boosted wordline voltage and the ground is performed during a manufacturing or testing process of the dynamic random access memory circuit before a normal operation of the dynamic random access memory circuit.

Another embodiment of the invention is a method for disconnecting shorted bitlines from a dynamic random access memory circuit that includes supplying a boosted wordline voltage to equalization lines in the integrated circuit, supplying a negative voltage to wordlines in the integrated circuit, activating equalization devices connected to the bitlines and the equalization lines and maintaining the boosted wordline voltage and the negative voltage until a short between a bitline and one of the wordlines causes a corresponding multiplexer device connected to the bitline to have a permanently elevated threshold voltage.

The difference between the boosted wordline voltage and the negative voltage causes an absolute voltage above a normal operating voltage of the multiplexer devices to be applied to the corresponding multiplexer device. The absolute voltage causes hot-carrier injection to occur within the corresponding multiplexer device to permanently elevate the threshold voltage. The elevated threshold voltage of the corresponding multiplexer device disconnects the bitline from a portion of the integrated circuit. The absolute voltage comprises a voltage at least twice the normal operating voltage of the multiplexer devices.

Additionally, the maintaining of the boosted wordline voltage and the negative voltage is performed during a manufacturing process of the dynamic random access memory circuit before a normal operation of the dynamic random access memory circuit.

With the invention the hot carrier effect is used to provide automatic isolation between the bitline equalization supply and bitlines which are shorted to wordlines. Thus, large current losses due to cross fails are prevented without the need for depletion current limiting devices. This invention is preferably implemented during the pre-fuse testing, so that the defective parts can be replaced by the redundancy during the following fuse operation.

The invention takes advantage of the hot carrier injection effect to change the device characteristics of transistors (e.g. precharge devices or PMUXes) which are attached to shorted bitlines, to effectively disconnect the shorted bitlines from the array, while not affecting the devices attached to normally functioning bitlines.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Hot-carrier-induced device degradation has long been recognized as a problem for metal oxide semiconductor (MOS) devices. As the device is scaled down, the channel electric field increases and the hot carrier effect becomes more of a concern. The hot carrier effect shortens the useful lifetime of the device by shifting its parameters, such as threshold voltage and transconductance.

However, the invention exploits the hot carrier effect to fix the wordline to bitline cross fail problem, discussed above, to disable the defective hardware (which is later replaced by an existing redundant circuit). The following embodiments describe how the hot-carrier effect may be used to automatically map out cross fails between lines in an integrated circuit. To illustrate the invention, bitlines and wordlines in a dynamic random access memory (DRAM) device are referred to in the following examples. However, the invention is not limited to a DRAM device, as would be known by one ordinarily skilled in the art given this disclosure. Indeed, the invention is equally applicable to any integrated circuit device that includes wiring which may short, such as synchronous random access memory (SRAM), electronically erasable programable read only memory (EEPROM), flash memories, etc.

Figure 1:
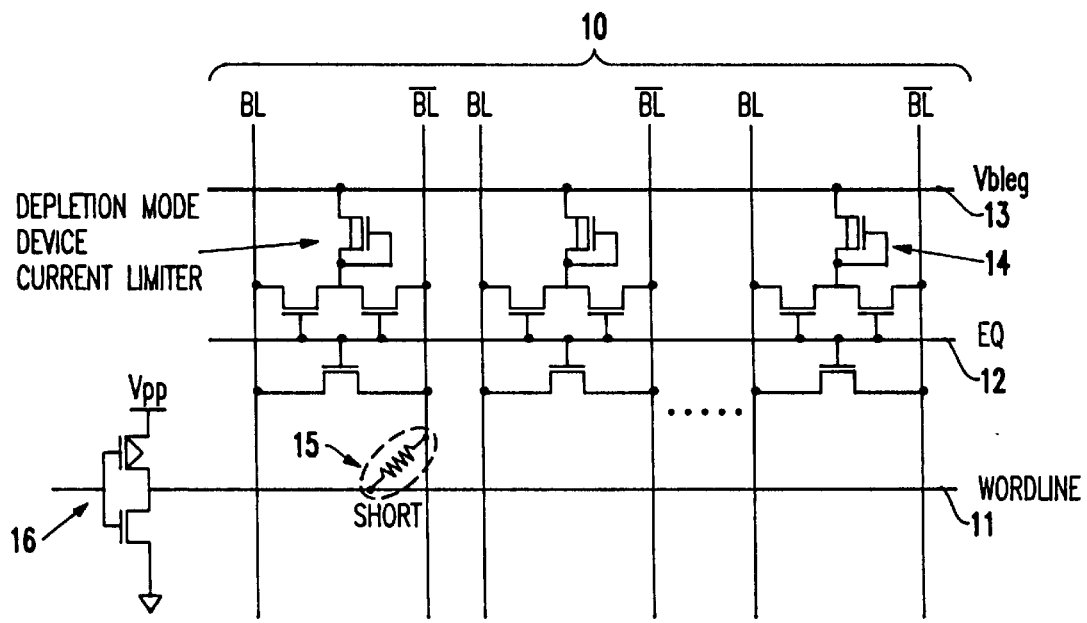
FIG. 1 is a schematic circuit diagram of a conventional integrated circuit structure.
Figure 2:
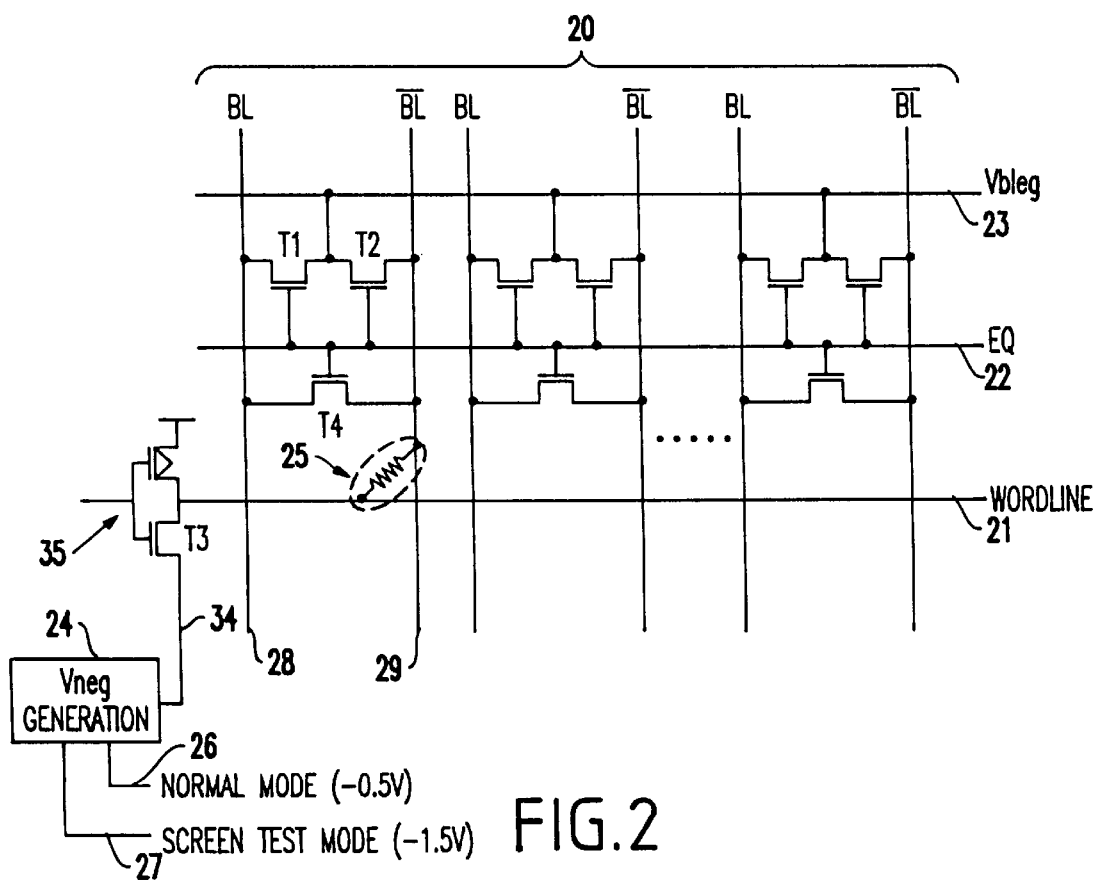
FIG. 2 is a schematic circuit diagram of a first integrated circuit structure according to the invention.

A first embodiment, shown in FIG. 2, is a DRAM device used with a conventional negative wordline protocol. FIG. 2 illustrates a schematic circuit diagram including bitlines 20, a wordline 21, an equalization control (EQ) line 22, an equalization supply (Vbleq) line 23, a negative voltage generator 24, a short 25 between one of the bitlines 20 and the wordline 21, a normal mode (e.g., −0.5V) input signal 26, an excessive voltage screen test mode (e.g., −1.5V) input signal 27 and precharge transistors T1, T2. As would be known by one ordinarily skilled in the art given this disclosure, the circuit illustrated in FIG. 2 selectively connects bitlines 10 to the equalization supply line 23 (using the transistors T1, T2) to equalize the voltage of the pairs of bitlines (e.g., complementary bitlines) 10 within the integrated circuit device.

In this embodiment, the negative wordline voltage supply 24 is designed so that during burn-in stress, the voltage level can be held at a level significantly above the normal operating level (e.g., at least twice as high), for example −1.5V in an integrated circuit which normally operates at −0.5V for the negative word line operation. In the screen test mode, all the wordlines are also held at −1.5V. If a short exists between a bitline 20 and a wordline 21, the defective bitline 20 will also be charged to a similar level, depending on the short resistance. If the short resistance is high then the current will already be limited and no further limiting will be required. However, cross fails between wordlines and bitlines which draw large current will be automatically screened out by the invention, as described below.

During conventional bitline equalization (e.g., the precharge period), the EQ control line 22 is turned on and is set to standard precharge voltages (e.g., is preferably set at an internal voltage (Vint)=2.1V) while the Vbleq equalization supply line 23 is similarly set to standard precharge voltages (e.g., 0.75V).

However, the invention deviates from standard precharge setups by supplying a highly negative voltage (e.g. −1.5V) to the wordline 21 which causes any N-type metal oxide semiconductor field effect transistors (NMOSFETs) T1 and T2 connected to a bitline 29 which is shorted to the wordline 21 to be subjected to significant hot carrier degradation and to be programed thereby.

More specifically, the transistors are programed as follows. During the precharge period, a highly negative voltage (e.g. −1.5V) is supplied from the Vneg generator 24 to the wordline 21, the short 25 and the bitline 29. When the wordline driver 35 is activated, the negative voltage will be conducted to the wordline 21 through a pull down N-type field effect transistor (FET) device T3 of the driver 35.

Thus, if a bitline 29 is dead shorted to the wordline 21, then the highly negative voltage will be conducted to that bitline 29. However, since the EQ line 22 is also activated, the equalization N-type FET device T4 will be conductive and both bitlines in the complementary bitline pair (e.g., bitlines 28 and 29) will be shorted. Therefore, both sources of the T1 and T2 devices will see the highly negative voltage.

The drains of transistors T1 and T2 are connected to the equalization supply line 23 and are, therefore, at the precharge level, e.g. 0.75V, while the sources of transistors T1 and T2 are connected to the bitlines 20 and see −1.5 volts through the short 25 to the wordline 21. Therefore, there is a voltage of 2.25V (e.g. 0.75v−(−1.5v)=2.25v) across the transistors T1, T2, which causes significant hot carrier degradation. Since devices T1 and T2 are customarily made with short channels, the efficiency of the hot-carrier programming is high. Thus, for a given period of programming time, the threshold voltage of these two devices will be raised which will force both bitlines 28 and 29 to be permanently disconnected from the equalization supply line 23.

Figure 3:
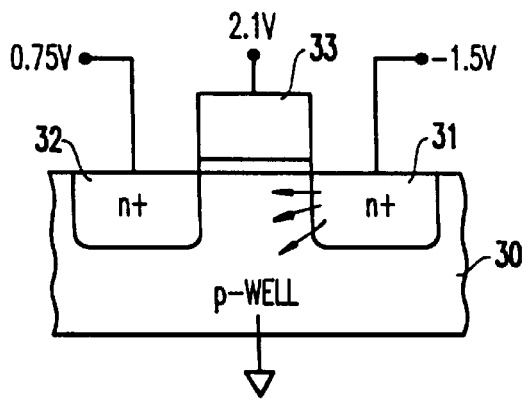
FIG. 3 is a schematic diagram of the voltages seen by a transistor in the invention.

FIG. 3 illustrates the hot-carrier programming in greater detail. During burn-in, a gate 33 voltage of 2.1V, drain 32 voltage of 0.75V and source 31 voltage of −1.5V is present in devices T1 and T2, as described above. While this stress condition results in a moderate drain 32 to source 31 voltage of 2.25, the source 31 to well 30 junction becomes forward biased at approximately 0.7–0.8V. The forward biasing of the source 31 junction results in a drastic lowering of the threshold voltage (Vt) and a large channel current. Furthermore, transistors T1 and T2 enter a bipolar conduction mode, resulting in a very large current in the bulk of the device (e.g., a snapback-like state).

The foregoing large channel current causes significant impact ionization to occur at the drain 32, resulting in the trapping of hot electrons which, in turn, causes a large permanent increase in threshold voltage of the transistors T1 and T2. While in this stress condition, the threshold voltage of transistors T1 and T2 increases significantly. Once the burn-in mode is terminated, this permanent increase in Vt results in transistors T1 and T2 isolating the Vbleq supply line 23 from the defective bitlines 28, 29 during normal operation.

It is preferable that devices T1 and T2 be designed with minimum channel length and width, to maximize the hot electron degradation. Furthermore, it is preferred that Vbleq 23 be a "stiff" (e.g., non-varying) supply to maximize the hot electron stress. Also, an auxiliary supply (which is greater than Vbleq) may be used to supply the drain voltage to T1 and T2 during the burn-in stress, once again to maximize the hot electron stress.

While the foregoing embodiment is discussed with respect to wordlines and bitlines in a dynamic random access memory, the invention is equally applicable to any circuit which includes control devices, such as transistors, and conductive lines which may be shorted. In view of this disclosure, one ordinarily skilled in the art would be aware that the intentional application of excessive voltage across the control devices (and the intentional infliction of hot electron stress within the control devices) can be used to automatically program the transistors to disconnect the shorted lines from the circuit in question. Therefore, as would be known by one ordinarily skilled in the art, the invention is applicable to a number of different circuit structures to isolate the shorted lines.

Further, while the foregoing exemplary embodiment only supplies the excess voltage to the wordline, as would be known by one ordinarily skilled in the art given this disclosure, an excess voltage can be supplied simultaneously or sequentially to a number of different types of conductive lines in order to determine whether the specific lines in question are shorted to any of the other lines, depending upon the specific type of circuit involved.

Figure 5:
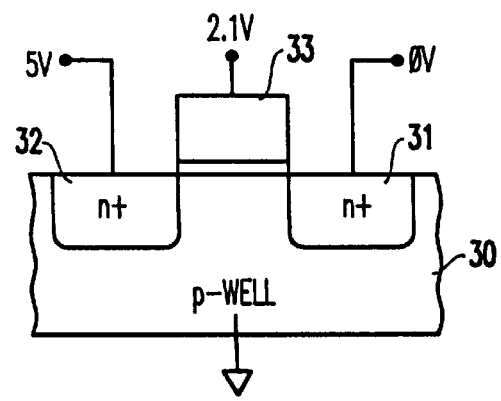
FIG. 5 is a schematic diagram of the voltages seen by a transistor in the invention.
Figure 4:
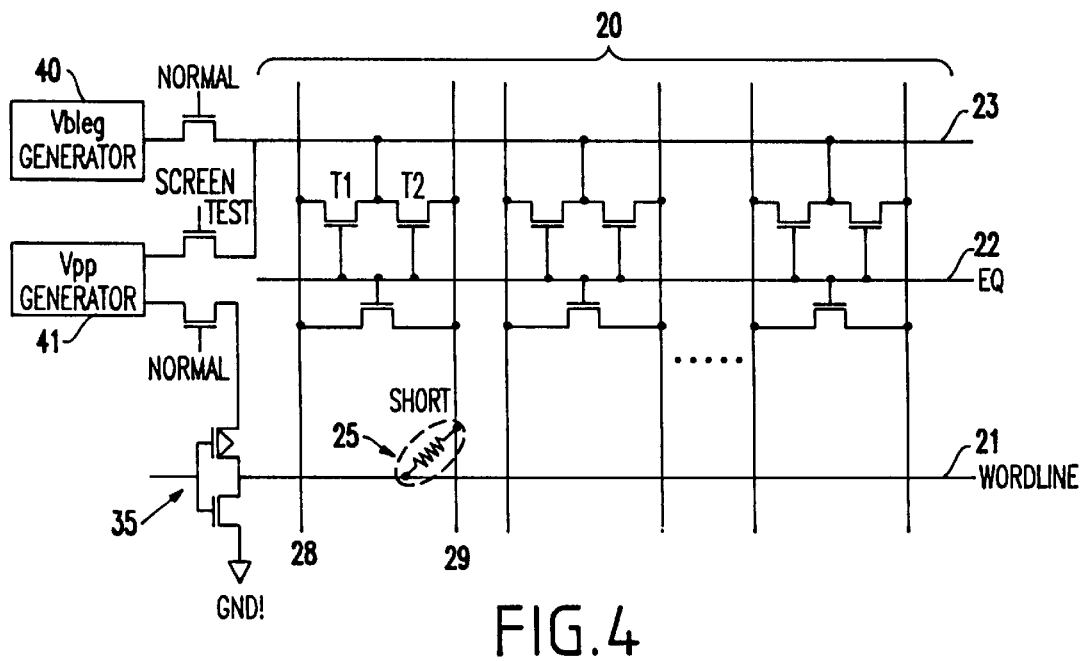
FIG. 4 is a schematic circuit diagram of a second integrated circuit structure according to the invention.

A second embodiment of the invention, which is illustrated in FIGS. 4 and 5 comprises a DRAM structure for use with a conventional boosted wordline approach. The same features discussed above are given the same identification numbering in the drawings and a redundant discussion of the same is omitted for sake of brevity.

More specifically, during the screening test, the boosted wordline supply 41 (e.g., Vpp), is connected to the Vbleq line 23 in place of the normally connected Vbleq generator 40. At the same time, all the wordlines 21 are held at ground. The voltage on the defective bitlines 28, 29 approach zero, since they are discharged to ground through the "complete short" 25. When the EQ line 22 is turned on, the precharge devices (T1 and T2) of the defective bitlines 28, 29 are again subjected to hot carrier stress, as described above, which effectively disconnects the defective bitlines from the integrated circuit device.

The voltages within the device structures T1, T2 during burn-in stress are shown in FIG. 5. In the second embodiment, the gate 33 has a voltage of 2.1V, the drain 32 has a voltage of 5 V and the source 31 has a voltage of 0V. During this stress condition, the threshold voltages of transistors T1 and T2 increase, as described above. Thus, transistors T1 and T2 become less conductive during normal operation and limit the current through the short 25.

The non-defective transistors which are connected to good bitlines are unaffected by the stress. The devices T1, T2 connected to defective bitlines 28, 29 maintain a permanent threshold (Vt) shift over the life of the product. Under normal operating conditions, precharge devices T1, T2 connected to bad bitlines 28, 29 are continually stressed, which adds to the value to the Vt shift, which is beneficial to the operation of this circuit.

Many variations of the above would be apparent to one ordinarily skilled in the art given this disclosure. For example, during the burn-in test, the Vbleq line 23 could also be linked to a Vneg supply. In such a situation, the channels of transistors T1, T2 devices would be subjected to a very heavy electron bombardment and the programming speed would be accelerated, for example, in the order of minutes or even shorter.

Similarly, as would also be known by one ordinarily skilled in the art given this disclosure, this embodiment can be used with electronically erasable programable read only memory (EEPROM) devices. The transistors T1, T2 could be flash memory cells with floating gates which would allow them to be programmed more precisely using any of the above-mentioned testing conditions.

Figure 6:
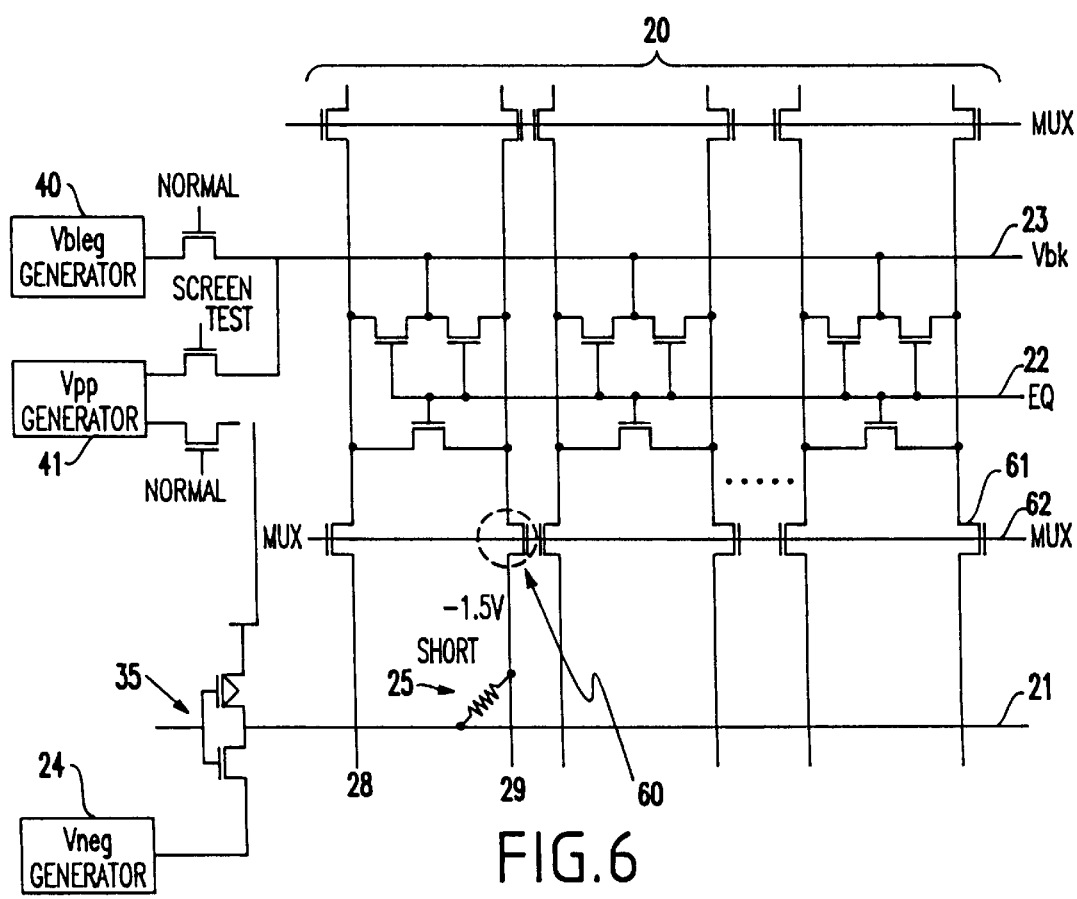
FIG. 6 is a schematic circuit diagram of a third integrated circuit structure according to the invention.

FIG. 6 illustrates a third embodiment of the invention useful with the substrate hot carrier programming approach. Once again, similar features are identified with similar numbers. In addition to the precharge devices T1 and T2, show in FIG. 6, multiplexer (MUM devices 61 connected to multiplexer control lines 62 are used to switch the array to a sense amplifier (not shown). With the invention, the MUX devices 61 can also be programmed so that the MUX 60 of defective bitline 29 acts as a current limiter.

More specifically, in this embodiment, during the screen test mode, the Vbleq line 23 is charged up to Vpp (e.g. 3.3V) and the wordline driver 35 is pulled low so that wordline 21 is at a negative voltage (e.g. −0.5V). Since bitline 29 is dead shorted to the wordline 21, bitline 29 is pulled low to the negative voltage. The drain of the MUX device 60, is at Vpp while its source is at Vneg, thus, the MUX device 60 will be programmed. In other words, the threshold voltage of the MUX 60 will be increased significantly which isolates the bitline 29 from the precharge devices.

This embodiment is advantageous over the previous embodiments, because a grounded p-well in the sense amplifier does not substantially decrease device performance. In such a situation, when there is a short between a bitline 29 and a wordline 21, the negative voltage from the wordline 21 only reaches the MUX device 60, and no forward biased junction will be seen in the sense amplifier.

Some devices may need a triple well with the invention (e.g., N-type FET devices), depending upon the specific circuit involved. As is well known, a triple well is a well which is completely isolated by another well with an opposite type of dopant. For example, in a triple well a P-well is surrounded by a N-well in a P-type substrate. The triple well requires a high energy ion-implant.

For example, in the first embodiment (e.g., negative wordline operation) a triple well may be needed for the N-type FET devices of the sense amplifier in order to avoid junction forward bias current flow during the screen test mode. The body of these N-type FET devices are preferably within a triple well and, thus, isolated from the substrate which is normally grounded. This will avoid unwanted latching of the N-type FET devices.

However, when the sense amplifier is located inside a triple-well, its performance is not as good as when it is in a P-type substrate with a solid ground. Therefore, for the negative wordline application, by programming the MUX device (as opposed to the equalization device) the sense amplifier can be positioned inside the P-type substrate, thereby increasing performance. Thus, only the N-type FET MUX devices need to be within a triple well to prevent forward bias current during the screen test mode. Therefore, with the invention the performance and reliability of the sense amplifier can be maintained even when a negative wordline scheme is implemented.

Figure 7:
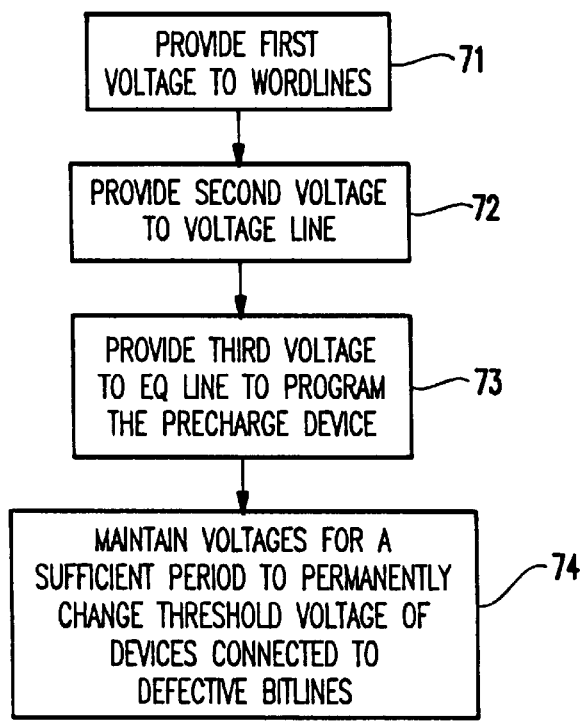
FIG. 7 is a flow diagram illustrating a preferred method of the invention.

FIG. 7 is a flowchart representation of an embodiment of the invention. In item 71, the first voltage (−1.5V or 0V) is supplied to the wordlines 21 and in item 72, the second voltage (0.75V or 5V) is supplied to the equalization supply line 23. In item 73, the invention provides third voltage (i.e., 2.1V) to the EQ line 22 to program the precharge device. In item 74, the voltage is held in these lines at these amounts for a period necessary to cause hot carrier degradation in the devices T1, T2 connected to bitlines 28,29 which are shorted to wordlines 21. As discussed above, this results in the voltage threshold of the devices T1, T2 being permanently increased, which effectively removes the defective bitline 29 and its complement 28 from the array.

With the invention, the hot carrier effect is used to provide automatic isolation between the bitline equalization supply 22 and bitline 29 which is shorted to the wordline 21. Thus, large current losses due to cross fails are prevented without the need for depletion current limiting devices. This invention is preferably implemented during the pre-fuse testing, so that the defective parts can be replaced by redundancy during the following fuse operation.

The invention takes advantage of the hot carrier injection effect to change the device characteristics of transistors (e.g. precharge devices T1, T2, or PMUXes 61) which are attached to a shorted bitline 29, to effectively disconnect the shorted bitlines from the array, while not affecting the devices attached to normally functioning bitlines 20.

While the invention has been described in terms of preferred embodiments, those skilled in the art will recognize that the invention can be practiced with modification within the spirit and scope of the appended claims.

What is claimed is:

1. A method for disconnecting shorted conductive lines from an integrated circuit comprising:

supplying a first voltage to first lines in said integrated circuit;

supplying a second voltage to second lines in said integrated circuit;

activating devices connected to said first lines and to conductive lines; and maintaining said first voltage and said second voltage until a short between one of said second lines and said conductive lines causes a corresponding device of said devices to have a permanently elevated threshold voltage.

2. The method in claim 1, wherein a difference between said first voltage and said second voltage causes an absolute voltage above a normal operating voltage of said devices to be applied to said corresponding device.

3. The method in claim 2, wherein said absolute voltage causes hot-carrier injection to occur within said corresponding device to permanently elevate said threshold voltage.

4. The method in claim 1, wherein said elevated threshold voltage of said device disconnects at least one of said conductive lines from a portion of said integrated circuit.

5. The method in claim 1, wherein said absolute voltage comprises a voltage at least twice a normal operating voltage of said devices.

6. The method in claim 1, wherein said maintaining of said first voltage and said second voltage is performed during one of a manufacturing process and a testing of said integrated circuit before a normal operation of said integrated circuit.

7. A method for disconnecting shorted bitlines from a dynamic random access memory circuit comprising:

supplying a precharge voltage to equalization lines in said dynamic random access memory circuit;

supplying a negative voltage to wordlines in said dynamic random access memory circuit;

activating equalization devices connected to bitlines and said equalization lines; and maintaining said precharge voltage and said negative voltage until a short between one of said bitlines and one of said wordlines causes a corresponding equalization device of said equalization devices to have a permanently elevated threshold voltage.

8. The method in claim 7, wherein a difference between said precharge voltage and said negative voltage causes an absolute voltage above a normal operating voltage of said equalization devices to be applied to said corresponding equalization device.

9. The method in claim 8, wherein said absolute voltage causes hot-carrier injection to occur within said corresponding equalization device to permanently elevate said threshold voltage.

10. The method in claim 7, wherein said elevated threshold voltage of said equalization device disconnects a corresponding one of said bitlines from a portion of said dynamic random access memory circuit.

11. The method in claim 7, wherein said absolute voltage comprises a voltage at least twice a normal operating voltage of said equalization devices.

12. The method in claim 7, wherein said maintaining of said precharge voltage and said negative voltage is performed during one of a manufacturing process and a testing of said dynamic random access memory circuit before a normal operation of said dynamic random access memory circuit.

13. A method for disconnecting shorted bitlines from a dynamic random access memory circuit comprising:

supplying a boosted wordline voltage to equalization lines in said dynamic random access memory circuit;

connecting wordlines in said dynamic random access memory circuit to ground;

activating equalization devices connected to bitlines and said equalization lines; and maintaining said boosted wordline voltage and said ground until a short between one of said bitlines and one of said wordlines causes a corresponding equalization device of said equalization devices to have a permanently elevated threshold voltage.

14. The method in claim 13, wherein a difference between said boosted wordline voltage and said ground causes an absolute voltage above a normal operating voltage of said equalization devices to be applied to said corresponding equalization device.

15. The method in claim 14, wherein said absolute voltage causes hot-carrier injection to occur within said corresponding equalization device to permanently elevate said threshold voltage.

16. The method in claim 13, wherein said elevated threshold voltage of said equalization device disconnects a corresponding one of said bitlines from a portion of said dynamic random access memory circuit.

17. The method in claim 13, wherein said absolute voltage comprises a voltage at least twice a normal operating voltage of said equalization devices.

18. The method in claim 13, wherein said maintaining of said boosted wordline voltage and said ground is performed during one of a manufacturing process and a testing of said dynamic random access memory circuit before a normal operation of said dynamic random access memory circuit.

19. A method for disconnecting shorted bitlines from a dynamic random access memory circuit comprising:

supplying a boosted wordline voltage to equalization lines in said dynamic random access memory circuit;

supplying a negative voltage to wordlines in said dynamic random access memory circuit;

activating equalization devices connected to bitlines and said equalization lines; and maintaining said boosted wordline voltage and said negative voltage until a short between a bitline of said bitlines and one of said wordlines causes a corresponding multiplexer device of multiplexer devices connected to said bitlines to have a permanently elevated threshold voltage.

20. The method in claim 19, wherein a difference between said boosted wordline voltage and said negative voltage causes an absolute voltage above a normal operating voltage of said multiplexer devices to be applied to said corresponding multiplexer device.

21. The method in claim 20, wherein said absolute voltage causes hot-carrier injection to occur within said corresponding multiplexer device to permanently elevate said threshold voltage.

22. The method in claim 19, wherein said elevated threshold voltage of said corresponding multiplexer device disconnects said bitline from a portion of said dynamic random access memory circuit.

23. The method in claim 19, wherein said absolute voltage comprises a voltage at least twice a normal operating voltage of said multiplexer devices.

24. The method in claim 19, wherein said maintaining of said boosted wordline voltage and said negative voltage is performed during one of a manufacturing process and a testing of said dynamic random access memory circuit before a normal operation of said dynamic random access memory circuit.

* * * * *